United States Patent
Dunleavy et al.

(10) Patent No.: US 7,948,674 B2
(45) Date of Patent: May 24, 2011

(54) ELECTRO-OPTIC WINDOWS

(75) Inventors: Michael Dunleavy, Bristol (GB); Sajad Haq, Bristol (GB); Joseph Maurice Davies, Bristol (GB); Harry John Finn, Lytham St. Annes (GB)

(73) Assignee: BAE Systems PLC, London (GB)

( * ) Notice: Subject to any disclaimer, the term of this patent is extended or adjusted under 35 U.S.C. 154(b) by 54 days.

(21) Appl. No.: 12/518,954

(22) PCT Filed: Dec. 7, 2007

(86) PCT No.: PCT/GB2007/050746
§ 371 (c)(1),
(2), (4) Date: Aug. 17, 2009

(87) PCT Pub. No.: WO2008/072010
PCT Pub. Date: Jun. 19, 2008

(65) Prior Publication Data
US 2010/0079842 A1    Apr. 1, 2010

(30) Foreign Application Priority Data

Dec. 13, 2006 (EP) .................................. 06256352
Dec. 13, 2006 (GB) .................................. 0624804.1

(51) Int. Cl.
  *G02B 13/14*    (2006.01)
(52) U.S. Cl. .................. 359/355; 977/742; 977/752
(58) Field of Classification Search .......... 252/502; 359/355, 356; 523/137; 977/742, 750, 752, 977/834
See application file for complete search history.

(56) References Cited

U.S. PATENT DOCUMENTS

| | | | |
|---|---|---|---|
| 6,265,466 B1 | 7/2001 | Glatkowski et al. | |
| 6,384,960 B1 | 5/2002 | Andrieux et al. | |
| 7,118,693 B2 * | 10/2006 | Glatkowski et al. | 252/502 |
| 2002/0159944 A1 | 10/2002 | Smalley et al. | |
| 2003/0122111 A1 * | 7/2003 | Glatkowski | 252/500 |
| 2005/0209392 A1 | 9/2005 | Luo et al. | |
| 2006/0113510 A1 * | 6/2006 | Luo et al. | 252/500 |

FOREIGN PATENT DOCUMENTS

| | | |
|---|---|---|
| DE | 10110468 A1 | 9/2002 |
| EP | 1445647 A1 | 8/2004 |
| JP | 2003215307 A | 7/2003 |
| WO | 02076724 A1 | 10/2002 |

OTHER PUBLICATIONS

International Search Report for PCT International Patent Application No. PCT/GB2007/050746, mailed on Jan. 31, 2008.
Written Opinion of the International Searching Authority for PCT International Patent Application No. PCT/GB2007/050746, mailed on Jan. 31, 2008.
International Preliminary Report on Patentability for PCT International Patent Application No. PCT/GB2007/050746, mailed on Jun. 16, 2009.

(Continued)

*Primary Examiner* — David N Spector
(74) *Attorney, Agent, or Firm* — Pillsbury Winthrop Shaw Pittman LLP

(57) ABSTRACT

An electro-optic window is made of a material substantially transparent to infra-red radiation and is treated to have reduced RF transmission characteristics by the provision of carbon nanotubes within the window or on at least one, surface thereof.

21 Claims, 8 Drawing Sheets

OTHER PUBLICATIONS

United Kingdom Search Report for Patent Application No. GB0624804.1, dated May 2, 2007.

Zhou et al., A Method of Printing Carbon Nanotube Thin Films, Applied Physics Letters, Mar. 27, 2006, vol. 88.

Xu et al., Microwave Shielding of Transparent and Conducting Single-walled Carbon Nanotube Films, Applied Physics Letters, May 4, 2007, vol. 90.

You et al., Directly Growing Ionic Polymers on Multi-walled Carbon Nanotubes Via Surface RAFT Polymerization, Nanotechnology, 2006, pp. 2350-2354, vol. 17, Institute of Physics Publishing, United Kingdom.

Chen et al., Noncovalent Engineering of Carbon Nanotube Surfaces by Rigid, Functional Conjugated Polymers, JACS Communications, Jul. 13, 2002, pp. 9034-9035, vol. 124, No. 31, American Chemical Society.

Shvartzman-Cohen et al., Selective Dispersion of Single-walled Carbon Nanotubes in the Presence of Polymers: the Role of molecular and Colloidal Length Scales, JACS Articles, Oct. 23, 2004, pp. 14850-14857, vol. 126, No. 45, American Chemical Society.

Boskovic et al., Large-area Synthesis of Carbon Nanotubes at Room Temperature, Nature Materials, Nov. 2002, pp. 165-168, vol. 1, Nature Publishing Group.

Zhang et al., Radio-Frequency Transmission Properties of Carbon Nanotubes in a Field-effect Transistor Configuration, IEEE Electron Device Letters, Aug. 1, 2006, pp. 668-670, vol. 27, No. 8, IEEE USA.

* cited by examiner

ELECTRO-OPTIC WINDOWS

CROSS REFERENCE TO RELATED APPLICATIONS

This is the U.S. National Phase of PCT/GB2007/050746, filed Dec. 7, 2007, which claims priority to British Patent Application No. 0624804.1, filed Dec. 13, 2006 and European Patent Application No. 06256352.3, filed Dec. 13, 2006, each of which are incorporated by reference herein in their entireties.

This invention relates to electro-optic windows which pass radiation in the infra-red waveband, and to methods of their production.

There are many applications where an infra-red transparent window is positioned in the optical path of electro-optic equipment to protect the equipment during use. Where such windows are used on military vehicles, they can give unwanted radar returns if they pass a substantial proportion of any incident RF transmission, and particularly in the microwave band, which is understood to refer to radiation in the waveband of from 2-18 GHz. This places stringent design criteria on the window so that it transmits in the infra-red and preferably also the visible spectral bands but does not transmit microwaves. The term 'window' is used broadly to mean an element capable of transmitting radiation in the optical and/or infra-red wavebands with or without optical power and so includes lenses as well as refractive and diffractive elements generally. The term 'transparent' is used to mean that the window transmits at least 90% at the mid value of the infra-red and/or optical wavebands.

In order to provide low RF transmission infra-red windows it is known to apply a metal mesh or grid to the surface of the window. However, the metal mesh adversely affects the optical and IR transmission characteristics and has several other drawbacks. The metal can react with the window material to cause adverse effects; where the window is exposed to water or sand abrasion, the thickness of the metal mesh can deflect water droplets or sand particles so as to accelerate abrasion of the window.

In some applications, zinc sulphide windows that exhibit low RF transmission are used in electro-optic sensors. Current window designs incorporate fine metal grids close to the surfaces of the zinc sulphide windows in order to reflect microwave radiation. The bulk zinc sulphide windows are manufactured by chemical vapour deposition and the grid is then produced by sputtering/chemical vapour deposition and so producing large areas is a problem. There are a number of problems with this approach. Such designs are not cost effective, it is difficult to ensure uniformity of the metal grids, and there is a high risk of environmental damage to the shielding metal grids. Encapsulation of the reflective grids by overgrowing with ZnS may circumvent the problems of environmental degradation, but this approach also suffers from scale-up difficulties and induced defects in the surface topography, and also creates the need for additional post-fabrication machining.

U.S. Pat. No. 6,265,466 suggests that carbon nanotubes may be useful to confer shielding properties to a polymer which is used in bulk for electromagnetic shielding applications. It is claimed that significant microwave shielding can be achieved at low volume fractions of nanotubes when the nanotubes are aligned in the polymer host. It is suggested that the shielding mechanism is achieved by absorption of microwaves. There is no mention of high IR transmission, and indeed, the nature of the bulk polymers disclosed would indicate high IR absorption and thus inherent unsuitability for any application to electro-optic windows.

Accordingly, it is an object of the present invention to overcome or at least substantially reduce some of the above mentioned drawbacks. It is a further object of the present invention to provide a window for electro-optic sensors that is highly transmissive or transparent to both infra-red and optical radiation, but which does not transmit to significant amounts of microwave radiation. A yet further object of the present invention is to provide a window for electro-optic sensors with a reduced susceptibility to environmental damage than prior known windows. It is also an object of the invention to provide a method of manufacturing an electro-optic window incorporating carbon nanotubes. Another object of the invention is to provide a window which provides good electrical continuity between the airframe (or other surrounding structure, the frame of the window and across the window itself.

In broad terms, the present invention resides in the concept of using the electromagnetic properties of carbon nanotubes in electro-optic windows, and in the methods of incorporating carbon nanotubes within window structures.

Accordingly, in one aspect, this invention provides an electro-optic window made of a material substantially transparent to at least one of infra-red and visible radiation and having reduced RF transmission characteristics by the provision of carbon nanotubes within the window or on at least one surface thereof.

We have found that the carbon nanotubes, being relatively inert, do not react adversely with the window material. Also the use of carbon nanotubes allows an electro-optic window to be produced having excellent IR and visible spectra transmission characteristics whilst providing a suitably low level of RF transmission. The nanotubes can be distributed in or on the window in the form of a coating or a layer, or as a dispersion within the bulk material itself. Where applied as a layer to one side of the window, the thickness of the layer required may be much less than that of the metal used previously and therefore have a reduced deflecting effect on the water droplets or sand particles and therefore reducing water or sand abrasion.

In one arrangement, the carbon nanotubes are provided as a layer on one surface of the window. The layer could be applied in the form of a mat. The mat may be perforated or otherwise provided with an array of holes to increase the IR and visible transmission whilst retaining the required low RF transmission characteristics. The mat may have a pattern of holes formed in it by a laser.

In another arrangement, the carbon nanotubes are incorporated into a film applied to a surface of the material transparent to IR and/or visible radiation, said film comprising a suitable carrier material incorporating said carbon nanotubes.

In another embodiment the carbon nanotubes are incorporated into the material transparent to infra-red radiation during the formation thereof. Thus, for example, the carbon nanotubes may be introduced during synthesis of the material transparent to infra-red radiation or during a sintering or pressing process.

The window material transparent to infra-red radiation may conveniently comprise a crystalline material or a glass material selected from the groups comprising zinc selenide, ZnS (8-10 μm), ZnS (Cleartran), CdTe, Sulphide glass, Selenide glass, $MgF_2$, $CaF_2$, $BaF_2$, KCl, AgCl, KBr, CsBr, CsI, KRS5, $SiO_2$, Silicate glass, aluminate glass, $Al_2O_3$, Spinel, Si, Ge, GaAs semiconductors; calcium aluminate glasses, germinate glasses, fluoride glasses; $MgF_2$, $CaF_2$, MgO hot pressed ceramics; $MgF_2$, $CaF_2$, $SrF_2$, $BaF_2$ melt grown fluorides; diamond, and processed borosilicate (Vocor).

The window material may also be a suitable polymer, as used for example on radomes. Such polymers include polyamides, epoxy resins, fibre-reinforced epoxy resins, chlorotrifluoroethylene, acrylic styrene acrylonitrile, acrylic styrene acrylonitrile polycarbonate blend, styrene acrylonitrile, styrene butadiene, and unplasticised polyvinyl chloride.

In another aspect, this invention provides a method of making an electro-optic window which comprises providing a distribution of carbon nanotubes within the window or on at least one surface thereof.

In one example, the method may comprise the step of providing a mat made of carbon nanotubes and bonding said mat to the surface of the window. Said mat may be made by preparing a sol of highly dispersed carbon nanotubes and drying the sol to provide a mat of nanotubes otherwise referred to as 'nanopaper'. In order to increase the infra-red transmission characteristics of the mat, it may be provided with an array of holes. In one example an array of holes may be provided over a central IR transmission region of the window, with the border thereof being imperforate to provide increased electrical conductivity. In one arrangement the holes are provided by laser drilling.

In another arrangement, the distribution of carbon nanotubes may be provided by applying to the surface of a window a dryable or curable liquid carrier containing a dispersion of carbon nanotubes. The liquid carrier may be applied to the window surface in a number of different ways including by spraying, optionally through a mask. The carrier may be a resin or polymer but forming a relatively thin layer so as not to significantly absorb infra-red and/or optical radiation, so that the window produced is still substantially transparent to infra-red and optical radiation.

In another arrangement, the liquid carrier containing a dispersion of carbon nanotubes is applied to said window surface using a spin-on process.

In another example, a particulate window precursor material is provided and carbon nanotubes are dispersed within said window precursor material to form a composite material. The precursor material particles are preferably mono-disperse. In a preferred method, the particulate window material is provided in colloidal form, with the carbon nanotubes being dispersed in said colloid which is thereafter dried and, if required, subjected to elevated pressure and temperature to form said window. In some circumstances, intensive processes such as hot isostatic pressing are required.

In another arrangement, the nanotubes are dispersed in a resin or polymer and thereafter applied to the surface of a window material.

In order to enhance the dispersion of carbon nanotubes within the window material they may be pre-coated with a suitable window material.

The above and further features of the invention are set forth in the appended claims and will be explained in the following by reference to various exemplary embodiments and the specific examples which are illustrated in the accompanying drawings in which:

Figure 8A:
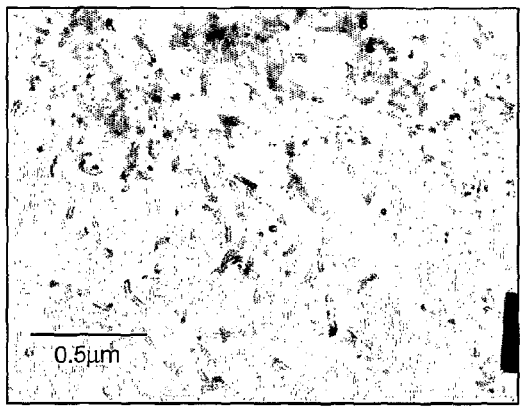
Figure 8B:
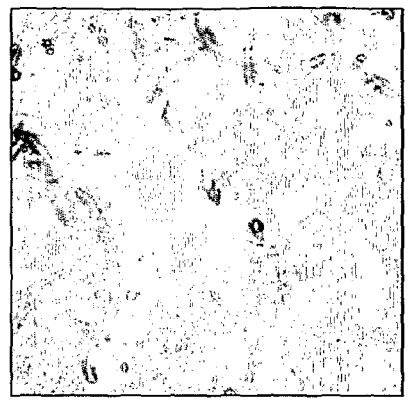
Figure 9A:
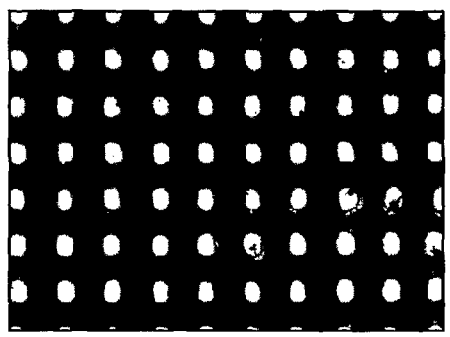
Figure 9B:
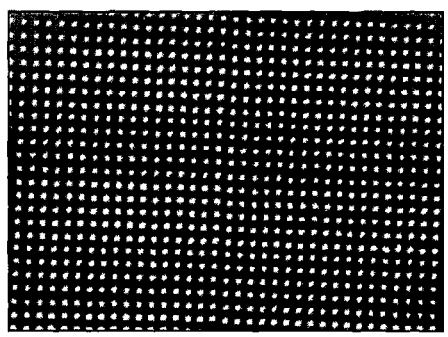
Figure 9C:
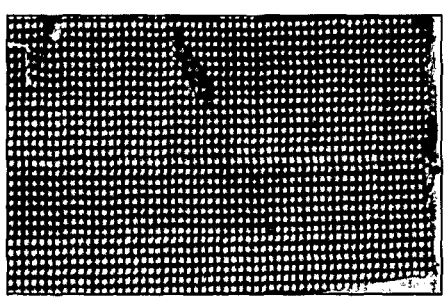
Figure 9D:
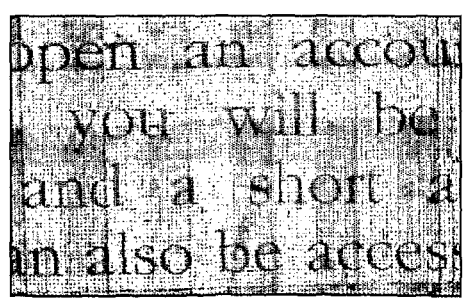
Figure 10:
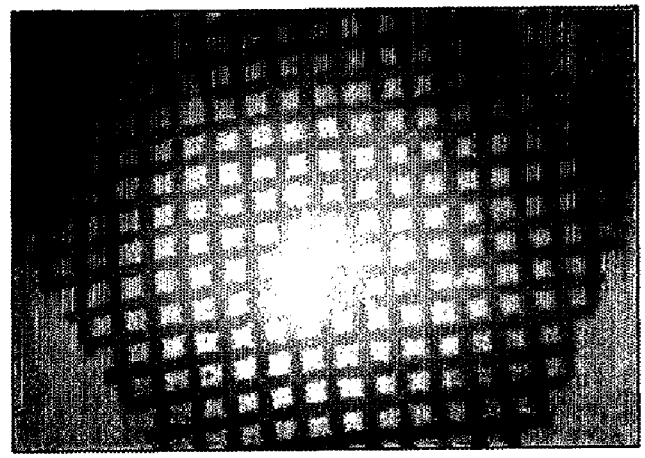
Figure 11:
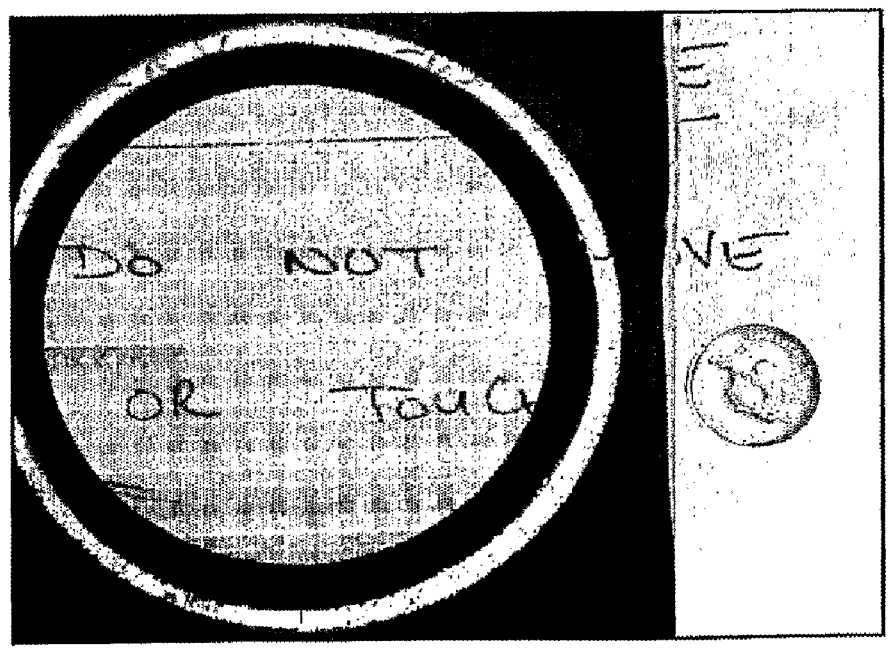
Figure 12:
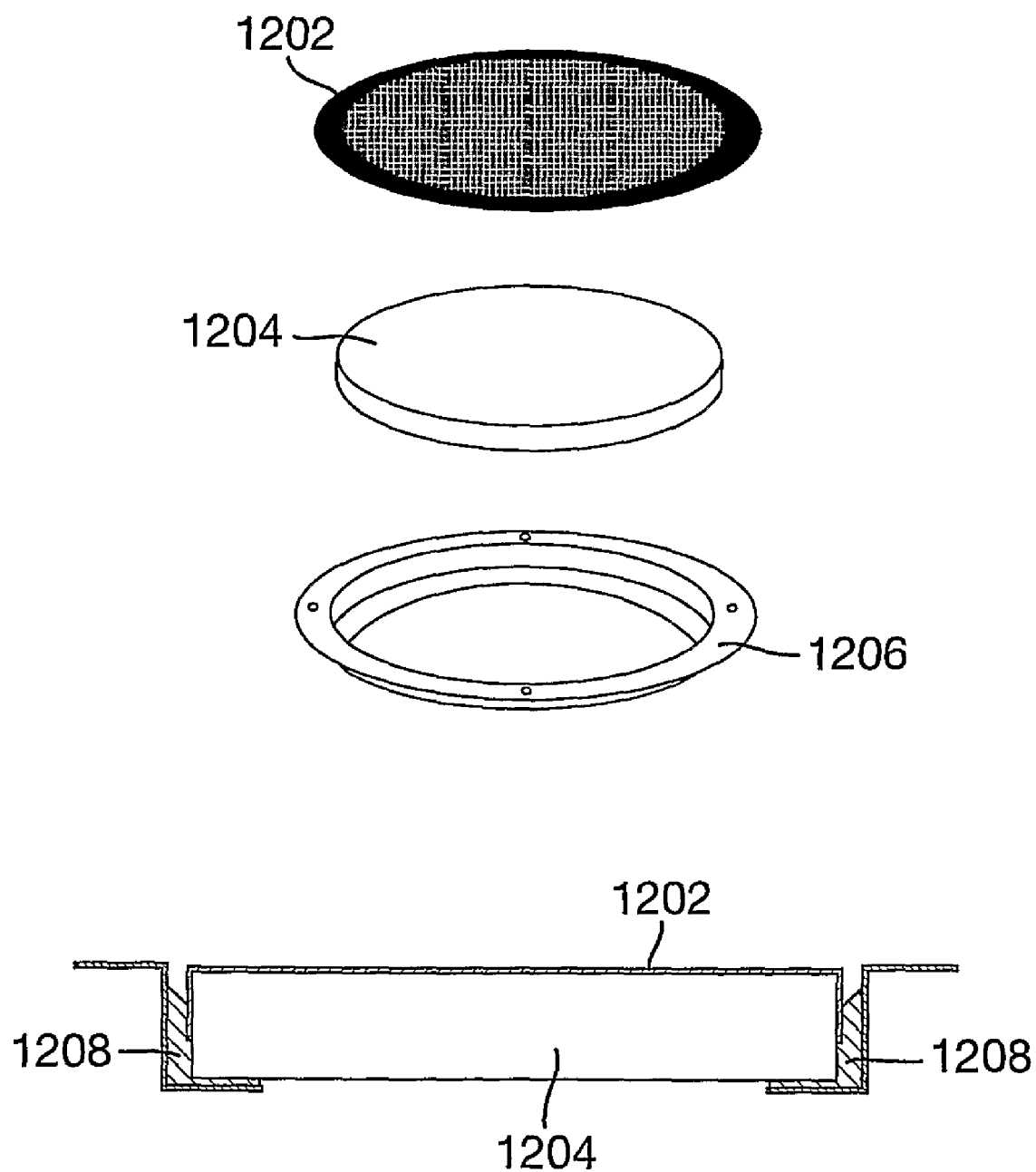
Figure 13A:
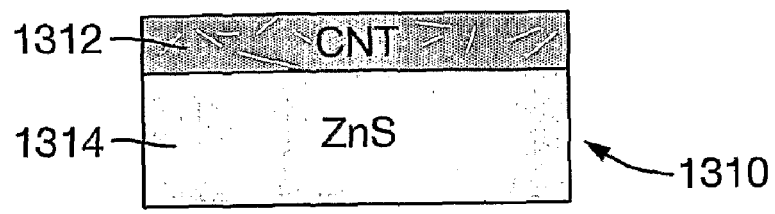
Figure 13B:
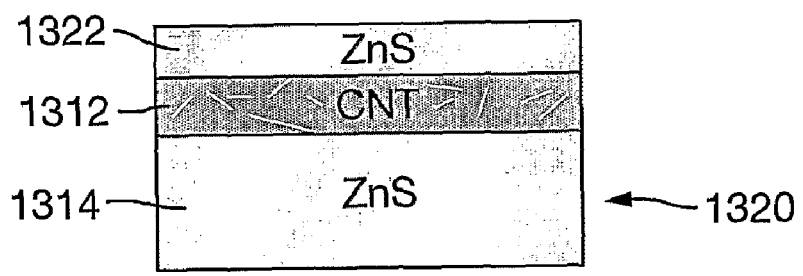
Figure 13C:
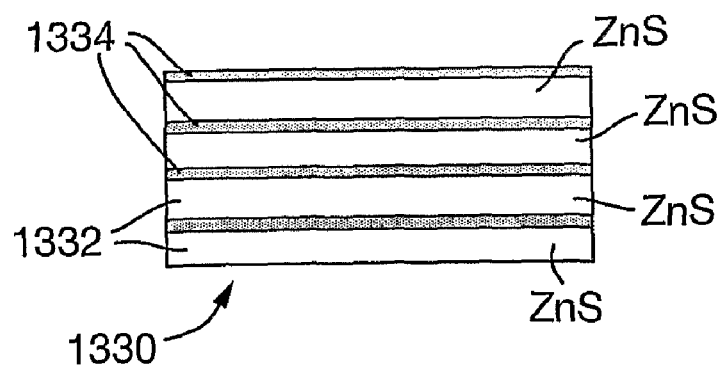

FIGS. 6(a)-(e) are photographic images of substrates sprayed with carbon nanotube paint;

FIGS. 7(a)-(d) are photographic images of nanotube dispersions in a polymer;

FIGS. 8(a) and 8(b) are transmission electron micrographs of a dispersion of carbon nanotubes in epoxy resin;

FIGS. 9(a)-(d) are photographic images of nanogrids according to embodiments of the invention, showing improvement to grid transparency as porosity is increased;

FIG. 10 is a photographic image of a nanotube mesh printed onto a zinc sulphide substrate;

FIG. 11 is a photographic image of the mounting of the nanotube/adhesive composite onto the drilling-frame;

FIG. 12 is a schematic representative of the lay-up of an electro-optic window; and FIGS. 13(a)-(c) are schematic illustrations of a number of electro-optic windows according to further embodiments of the invention.

Carbon nanotubes are commercially available and can be purchased from a number of suppliers including CNI, Carbolex and Nano-Lab. They can be obtained in two general forms: single wall nanotubes (SWNT) and multi-wall nanotubes (MWNT). MWNT comprise several concentric SWNTs. SWNTs have diameters of order 1 nm, whilst MWNTs are larger, with diameter 10-20 nm. Both SWNTs and MWNTs exhibit similar and good electrical activity, but the former are preferred for the current invention because their electrical performance is better for a given weight of nanotube material. Certain polymers, such as Ionic polymers [Ye-Zi You et al, Nanotechnology 17 (2006) 2350-2354]; Poly(aryleneethylene)s [Chen et al, J. Amer. Chem. Soc., Vol 124, pp 9034-9035, (2002)] and Block co-polymers [Shvartzman-Rozen et al, J. Amer. Chem. Soc., Vol 126, pp 14850-14857] can be absorbed onto the surface of nanotubes in order to create wrapped nanotubes. Wrapped nanotubes are also commercially available in SWNT and MWNT forms. Wrapped nanotubes can be purchased from Zyvex Corporation, 1321 North Plano Road, Richardson, Tex., USA TX75081-2426, and many other sources.

All carbon nanotubes tend to strongly aggregate during manufacture resulting in the formation of tightly bound clusters of nanotubes. In order to fully exploit their electromagnetic properties for electro-optic window applications, it is necessary to separate and stabilise the individual nanotubes. The process of separating nanotubes is referred to in the art as "exfoliation", and the term "exfoliation" will be used as such hereinafter.

Figure 1:
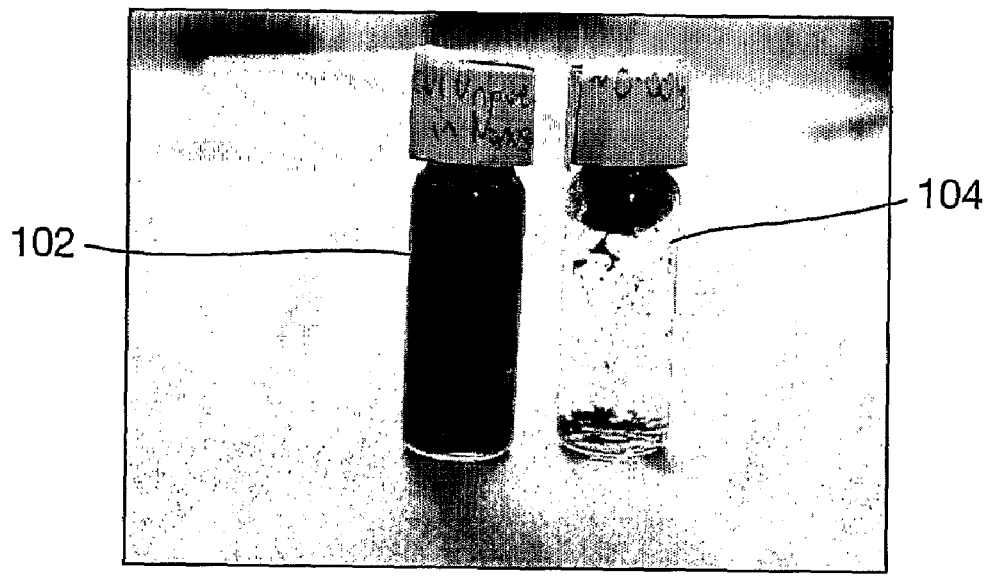
FIG. 1 is a photographic comparison of a good dispersion and a poor dispersion of nanotubes in solvent.

Exfoliation can be achieved using solvents in conjunction with mechanical agitation and/or ultrasound to create a carbon nanotube suspension. Good exfoliation is achieved in organic solvent systems. The most stable and concentrated suspensions are obtained using dichlorobenzene, although it is possible to use other organic solvents to achieve exfoliation, including: non-polar solvents such as toluene and a variety of short chain, long chain and branched alkanes; polar aliphatic solvents, such as ethanol, methanol, acetonitrile, dimethylformamide and dimethysulphoxide; polar aromatic solvents including nitrobenzene and benzonitrile; halogenated solvents including chloroform, chloroalkanes, polychloroalkanes, chlorobenzene, dichlorobenzene and bromoalkanes; basic solvents, such as butylamine, aniline and N-methylpyrrolidone; and acidic solvents such as acetic and propionic acids. Using dichlorobenzene, dispersions are obtained that remain stable for many tens of minutes, even at concentrations as high as 1 mg/10 ml. These dispersions are brown or black suspensions that are clear to the eye. Microscopy reveals an absence of aggregates in these suspensions, indicating that good exfoliation has been achieved. A comparison of a typically poor suspension 104 found in surfactant systems and a good suspension 102 found in dichlorobenzene is shown in FIG. 1. MWNTs disperse better in these suspensions than SWNTs. It is believed that SWNTs are more flexible than MWNTs, such that they entangle more intimately, from more tightly bound clusters, and are more difficult to exfoliate than MWNTs.

In the case of polymer-wrapped nanotubes, prolonged application of ultrasound is necessary to improve the dispersion. Even after the application of ultrasound, it is necessary to use the resulting wrapped-nanotube suspensions immediately in order to avoid re-aggregation. Both aqueous and non-aqueous wrapped-nanotube suspensions can be used in the fabrication of electro-optic windows.

In order to fabricate bulk zinc sulphide (ZnS) windows loaded with nanotubes, a first step is the uniform dispersion of nanotubes within ZnS. A problem with this step is the large range of particle sizes found in commercially available ZnS. This lack of homogeneity makes it possible to prepare only inhomogeneous dispersions of nanotubes in ZnS when starting from commercially available ZnS powder. Instead, the present inventors have found that homogenous dispersions of carbon nanotubes in ZnS can be prepared from colloidal ZnS. The reaction between sodium sulphide and zinc nitrate produces high purity, colloidal zinc sulphide as an aqueous dispersion that is stable over many days, and that comprises submicron sized particles of approximately uniform size (i.e. it is monodisperse).

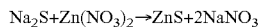

$$Na_2S + Zn(NO_3)_2 \rightarrow ZnS + 2NaNO_3$$

Figure 2:
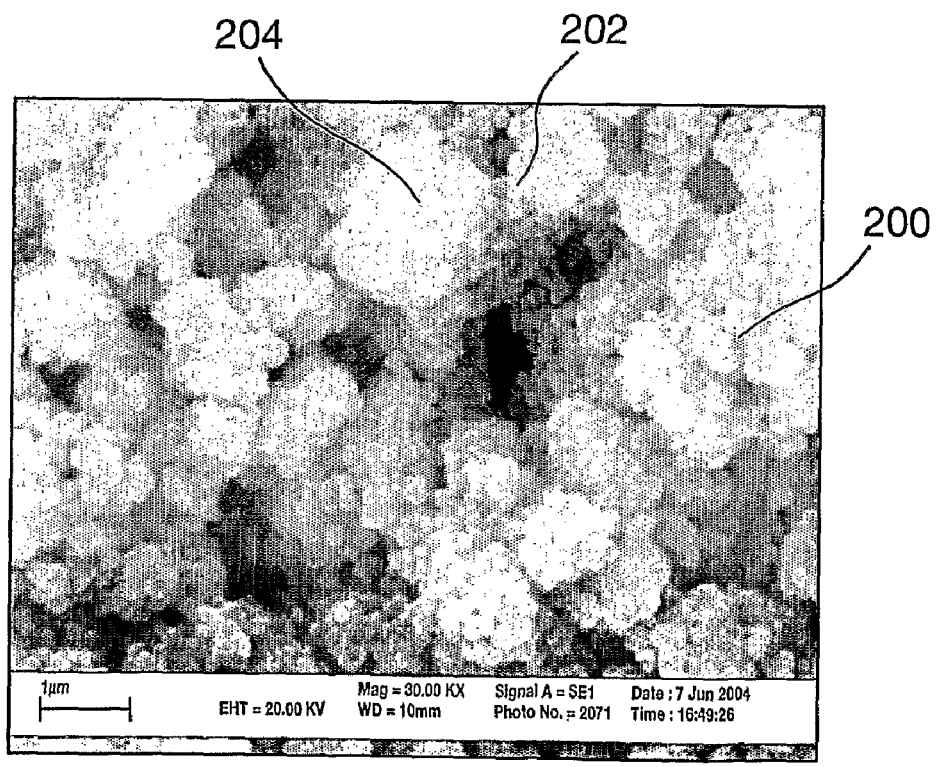
FIG. 2 is an electron micrograph of dried colloidal zinc sulphide.

Drying this aqueous dispersion results in the powder 200, shown in the electron micrograph illustrated in FIG. 2. The submicron spherical particles 202 can be seen clearly within the aggregations 204. The high purity of the product was confirmed using x-ray diffraction and energy dispersive x-ray analysis. An advantage of this approach is that the high surface energy associated with small particulate material should facilitate sintering and hot isostatic pressing (a process referred to hereinafter as hipping) processes necessary at a later stage in the manufacturing of the electro-optic window, to be described below.

Polymer-wrapped nanotubes readily disperse within the colloidal ZnS to yield grey dispersions that remained stable for several days. It is currently believed that it is not possible to produce long-term stable dispersions of unwrapped nanotubes within the colloidal ZnS, even with the aid of surfactants and ultrasound.

EXAMPLE 1

Zinc sulphide was generated in the presence of carbon nanotubes. Thus, an aqueous dispersion of single wall nanotubes obtained as a dispersion from Zyvex (10 ml) was added to a mechanically stirred solution of sodium sulphide monohydrate (2.44 g in 100 ml of deionised water) in a flask immersed in an ultrasonic bath with the ultrasound applied. The nanotubes remained suspended. An aqueous solution of zinc nitrate hexahydrate (3.02 g in 100 ml of deionised water) was slowly added to the stirred mixture contained in the flask whilst still applying ultrasound. On addition of the zinc salt, the mixture in the flask became cloudy. The mixture was left to stir without ultrasound for 24 h. The colloidal product was collected by repeated centrifugation, decanting the supernatant fluid, and re-dispersing in fresh deionised water. After four successive cycles the product was re-dispersed in deionised water to give an aqueous colloidal dispersion of nanotubes and zinc sulphide.

TEM revealed that the nanotubes had a coating of zinc sulphide. The nanotubes could be isolated from the bulk zinc sulphide by fractional centrifugation.

The same method when performed in the absence of carbon nanotubes generated highly pure colloidal zinc sulphide.

Figure 4:
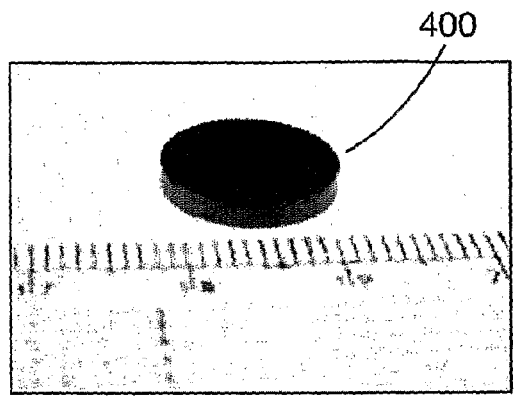
FIG. 4 is a photographic image of a nanotube/ZnS pellet.

Careful drying of the ZnS colloids and the nanotube-loaded ZnS colloid furnished material that could be compacted into pellets. FIG. 4 shows a typical 10 mm diameter nanotube-loaded pellet 400, in which the nanotube loading is 5 wt %. Larger samples can be manufactured as required.

EXAMPLE 2

Materials suitable for compaction could be prepared by drying the cleaned colloid (contained in a Petri dish) in air at 80° C. The resulting solid was gently powdered using a mortar and pestle. The powder could then be compacted using stainless steel dies (1 cm and 3 cm diameter) and applying a pressure of about 10 Tonne per cm$^2$; a typical pressure range is from 5 to 15 Tonne per cm$^2$.

Gels were prepared by slow evaporation of the water from the colloid. This was achieved by placing the colloid dispersion (either neat ZnS or carbon nanotube/ZnS) on the surface of a dense immiscible liquid (bromobenzene or diethyl phthalate) contained in a PTFE beaker that had previously been sprayed with PTFE lubricant. The water was allowed to slowly evaporate at room temperature (~20° C.) over two or three days. In this way a gel disk was formed that floated on the denser organic liquid. For neat ZnS the disk was transparent. For CNT/ZnS the disk was black.

To make useful windows from zinc sulphide, hipping must be applied. The hipping process is a high temperature and high pressure process that converts zinc sulphide to its optically transparent form. Typically, the process is carried out in a gas environment at a pressure of order 0.1 GPa, and at a temperature of 1000° C. The exact conditions required vary in dependence on the configuration of the chamber in which the hipping is performed. Hipping of the nanotube-loaded ZnS compacted pellets results in a nanotube-loaded ZnS window.

Sintering may be necessary before hipping is applied. Sintering is a process in which compacted inorganic materials are heated to a temperature at which fusing of contiguous particles occurs, leading to a single-bodied, monolithic structure. This process is used widely to make ceramics.

Pellets of nanotube-loaded zinc sulphide (prepared via the colloid route described earlier) can be sintered under conditions similar to those used for pure zinc sulphide. During the sintering process, the material becomes lighter in colour. This lightening is a bulk phenomenon visible when sintered samples are broken, implying that it is a bulk, not surface, phenomenon. It is believed that the change in colour is not associated with loss of carbon but merely a result of a change in the scattering characteristics of the densified body following heat treatment. Since zinc sulphide samples that have a nanotube grid imprinted into them are virtually unchanged in colour following sintering (i.e. the carbon grid remains and the underlying zinc sulphide does not undergo a colour change) it is further believed that little or no carbon is lost during sintering. Subsequent hipping of sintered nanotube-loaded ZnS then produces a nanotube-loaded ZnS electro-optic window.

The nanotube-loaded ZnS windows exhibit improved microwave shielding as compared to pure ZnS windows. Furthermore, since the shielding is provided by nanotubes incorporated within the ZnS, and not by a metallic grid on an external surface of the window, the window also exhibits improved resistance to environmental damage as compared to prior known windows.

In order to obtain windows with the desired electro-magnetic properties, the level of nanotube loading should be selected accordingly. As the nanotube loading is increased, the microwave transmission decreases (due mainly to enhanced reflection, rather than absorption). The optical and infra-red transmissivity, however, also decrease. These conflicting requirements must be balanced in order to obtain the correct properties for a given application. It is notable that microwave, infra-red and optical transmission also decreases as the effectiveness of the dispersion of the nanotubes within the window is increased. Good dispersion of the nanotubes is thus highly desirable, and makes lower nanotube loadings (of order 1.5 wt %, or 2.5 wt %) possible, whilst retaining effective shielding.

A number of alternative methods of construction of electro-optic windows are envisaged that are in accordance with further embodiments of the invention.

It is possible to grow a thin layer of ZnS onto the nanotubes themselves. There are two advantages associated with ZnS-coated nanotubes. Firstly, attenuation of microwave radiation by nanotubes occurs, in part, by an intrinsic loss mechanism. The magnitude of this loss increases as the quality of dispersion of the nanotubes improves. Thus, it may ultimately be possible to exploit a large intrinsic loss mechanism associated with electrically isolated neighbouring nanotubes within a window structure. This has the advantage of reducing the radar return from the infra-red window if the application requires absorption rather than reflection. Secondly, the ability to coat the deposited nanotubes with a few molecular layers of zinc sulphide via a solution route should enable subsequent growth.

Figure 3A:
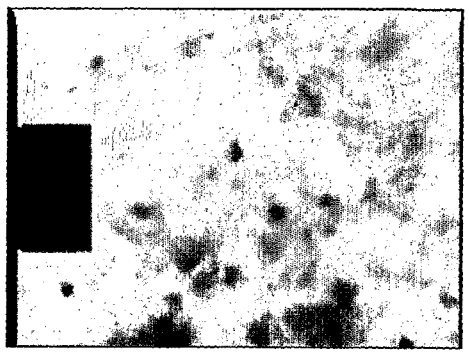
FIG. 3(a) is low magnification electron micrograph image of a ZnS composite.
Figure 3B:
FIG. 3(b) is a high magnification electron micrograph image of the ZnS composite shown in FIG. 3(a) showing nanotubes.
Figure 3C:
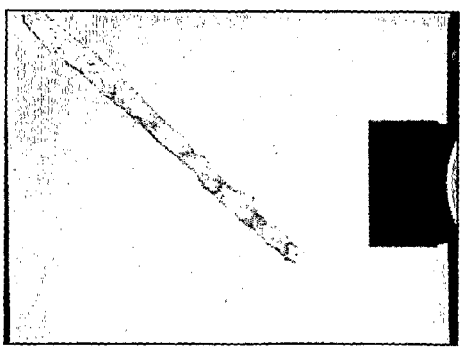
FIG. 3(c) is a yet higher magnification of the ZnS/CNT composite shown in FIG. 3(a) illustrating an individual ZnS-coated nanotube.
Figure 3D:
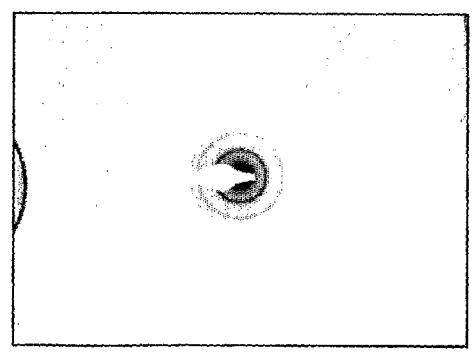

Using a range of reaction conditions and choice of surfactant it is possible to use solution and colloid chemistry to deposit a thin layer of zinc sulphide onto carbon nanotubes as obtained in Example 1. FIG. 3a shows a transmission electron micrograph of zinc sulphide/CNT composite showing good distribution of the carbon nanotubes. At a higher magnification (FIG. 3b) the separate and individual nanotubes can be seen. At still higher magnification (FIG. 3c) isolated single nanotubes can clearly be seen. The presence of the zinc sulphide coating on the nanotube was confirmed by electron diffraction.

The possibility of epitaxial growth of ZnS onto ZnS-coated nanotubes enables further construction methods for windows incorporating carbon nanotubes. In particular, ZnS-coated nanotubes can be deposited on to bulk ZnS, and then a 'protective' layer of ZnS or other suitable material such as a polymer or a glass material, can be grown directly onto the carbon nanotubes. This layer reduces the risk of environmental damage to the nanotube layer, once the window is in use. In such a window the nanotubes would not be dispersed within the bulk ZnS, thereby simplifying the manufacturing process through obviating the step of dispersing the nanotubes within ZnS.

The step of dispersing the nanotubes within bulk ZnS can alternatively be achieved by growing nanotubes directing onto ZnS particles or crystallites, prior to pressing. This avoids the need for mixing a suspension of nanotubes with colloidal ZnS, whilst still ensuring homogenous distribution of nanotubes in the electro-optic window. Furthermore, growth of nanotubes directly onto ZnS particles avoids the problem of clustering of nanotubes, and therefore removes the need for exfoliation. It may be necessary to use an intermediate nucleating layer on the ZnS particles in order to start nanotube growth. Such nucleating layers are, however, routinely used in nanotube growth.

FIG. 13 schematically shows a number of electro-optic windows, incorporating carbon nanotubes, fabricated using growth techniques. FIG. 13(a) shows a window 1310 that is formed of two components: a ZnS substrate 1314, that can be fabricated using well known techniques, such as chemical vapour deposition techniques, and a nanotube layer 1312. Nanotube layer 1312 can be grown directly onto this substrate (without the need for using commercially available nanotubes) by arc-discharge, plasma chemical vapour deposition, or RF-assisted chemical vapour deposition techniques. Such growth techniques are known to those skilled in the art and described in, for example Boskovic, Stolojan, Khan, Haq, and Silva, Nature Materials, Vol 1, (2002), p 165. Nanotube layer 1312 may comprise either SWNTs, or MWNTs, or a mixture of SWNTs and MWNTs. It may be necessary to deposit a small nucleating layer (not shown) onto the ZnS substrate before nanotube growth. This layer, however, need only comprise discontinuous islands of nanometer dimensions, and does not, therefore, interfere with the electromagnetic properties of the window 1310. The nucleating layer may be a very thin metallic coating, applied using chemical vapour deposition techniques in situ, or may be applied by dispersing very fine particles onto the substrate.

As described above with reference to ZnS-coated nanotubes, the window 1310 may be capped with an additional ZnS layer 1322 grown, in situ, immediately on top of the nanotube layer 1312. Such a window 1320 is shown in FIG. 13(b). FIG. 13(c) shows a window 1330 in which this concept has been extended to produce a layered structure. Window 1330 comprises layers of ZnS 1332 interleaved with layers of nanotube material 1334. The layered structure allows a through-thickness distribution of nanotubes to be incorporated in the window 1330.

Figure 5:
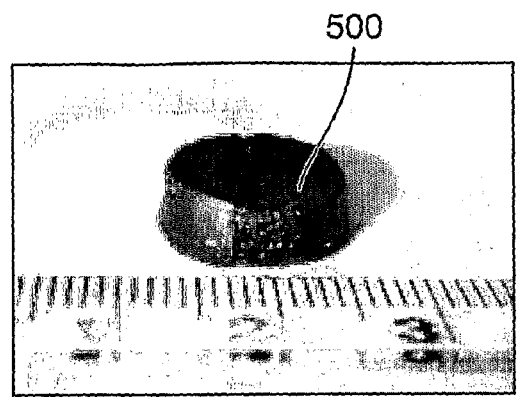
FIG. 5 is a photographic image of a ZnS gel incorporating carbon nanotubes.

It is also possible to fabricate ZnS and nanotube-loaded ZnS gels by applying appropriate drying conditions to ZnS nanotube-loaded ZnS colloids FIG. 5 shows a nanotube-loaded ZnS gel 500 according to an embodiment of the invention. The gel 500 is opaque. ZnS gels, without added nanotubes, were found to be transparent.

A further method for the preparation of nanotube/ZnS structures is to spray-deposit nanotube patterns onto bulk ZnS. Deposition of useful arrays of nanotubes can be accomplished prior to any high temperatures or high pressure treatments. Nanotube based paints according to embodiments of the invention can be prepared from polymer-wrapped SWNTs.

Single wall nanotubes are separated using ultrasound and stabilised by the adsorption of polymers containing many aromatic (benzenoid) moieties within their structure. The polymer forms around the nanotube (or small clusters of nanotubes) and gives it an affinity for organic solvents. By choice of polymer water-compatible nanotubes can also be prepared. The presence of the polymer partially insulates the nanotubes, thereby decreasing the electrical conductivity of a nanotube network.

In one example, wrapped single wall nanotubes coated with pi wrapped polymers are dispersed in a volatile solvent such as dichloromethane (1 mg nanotubes/1 ml solvent) to produce a paint suitable for spraying. A π wrapped polymer contains many delocalised π electron bonds within the structure. Interaction between polymer and nanotube is believed to result from interactions of the π systems of the polymer with the delocalised electron system of the nanotube.

Figure 6A:
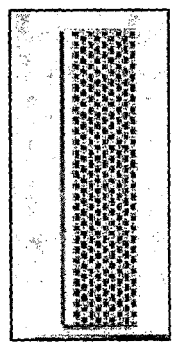
Figure 6B:
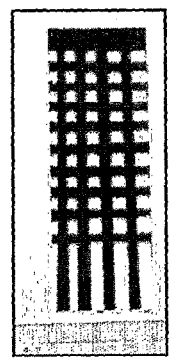
Figure 6C:
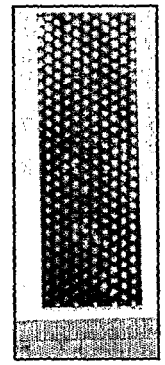
Figure 6D:
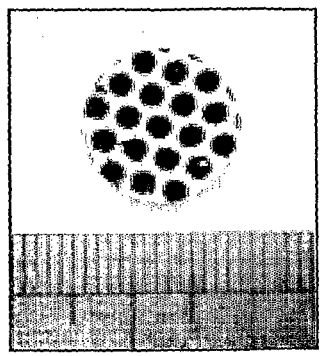
Figure 6E:
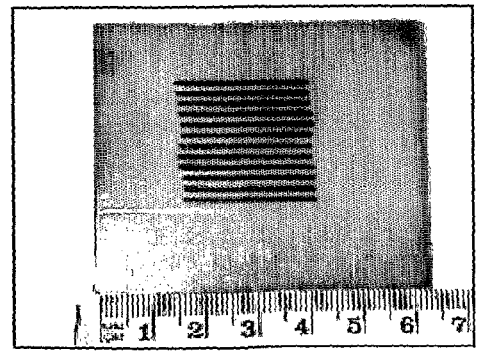
Figure 7A:
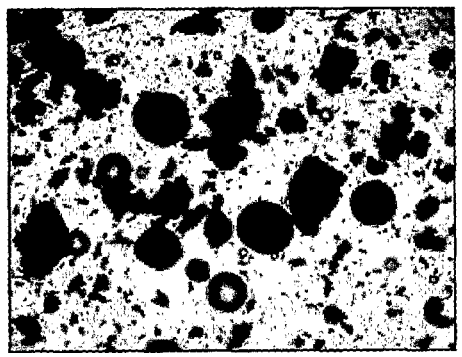
Figure 7B:
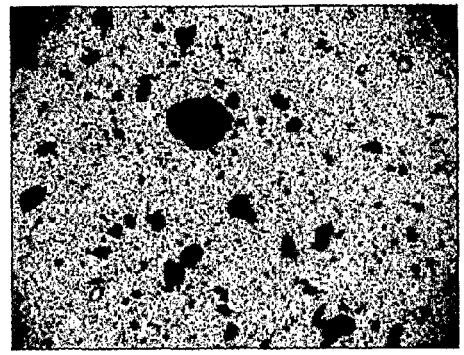
Figure 7C:
Figure 7D:
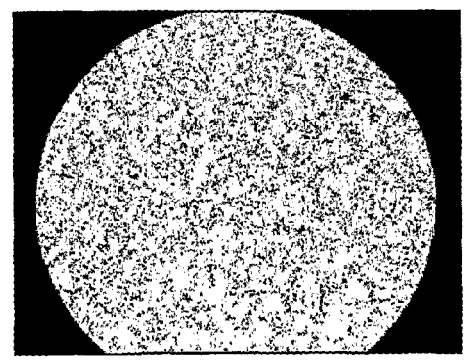

Using the appropriate templates a range of patterns were deposited via an airbrush onto both glass and zinc sulphide substrates and some examples are shown in FIG. 6(a)-(e). FIGS. 6(a)-(c) show patterns of carbon nanotubes deposited on glass, FIG. 6(d) shows carbon nanotubes deposited on pressed ZnS, and FIG. 6(e) shows carbon nanotubes deposited on transparent ZnS. The spatial resolution that could be achieved was limited by the quality of the templates and the crudeness of the airbrush spray pattern. It is to be appreciated that the paint formulation can be modified for use in high spatial resolution deposition devices such as inkjet printers, for example by using a less volatile solvent.

Nanotubes can be dispersed in polyamic acid to produce a coating for an electro-optic window. A high shear dispersion tool (Ultra-Turrax dispersion tool LT25, IKA) is applied to a mixture of polyamic acid and as-bought carbon nanotubes, and the resulting viscous products are spun onto silicon wafers. Subsequent heat treatment converts the polyamic acid into polyimide. Nanotube loadings of up to 2.5 wt % can be achieved, with higher loadings leading to products that are too viscous to process. FIGS. 7(a)-(d) show how the homogeneity of final nanotube/polymer film improves with prolonged application of the dispersion tool to the mix. It is apparent that even after 36 hours of processing the nanotube clusters and aggregates have not been truly broken up. Nevertheless, these samples are sufficient to allow investigation of the electromagnetic properties as a function of loading level and dispersion.

Nanotubes can also be dispersed in epoxy resin for the purpose of studying the microwave, optical and infra-red properties of nanotubes within composites. Nanotubes have an affinity (albeit not great) for organic materials containing the amine function. Bipartite epoxy resins comprise an epoxy compound and an amine hardener. Excellent dispersions of nanotubes in resin samples are obtained by employing a novel mixing method according to a further embodiment of the invention.

EXAMPLE 3

Two methods were used to incorporate nanotubes into resins. In the first, nanotubes were dispersed in the hardener moiety of a bipartite resin using a high dispersion tool. For high loadings of nanotubes it was necessary to add a solvent such as chloroform, or trichloroethane; N-Methyl pyrrolidone was used as a solvent where thin films were prepared by spinning the epoxy mix onto a flat surface such as silicon or glass. Sufficient liquid was added to maintain fluidity so that the dispersion tool would operate efficiently. At low nanotube loadings (<1 wt %) the volume of solvent was about ¼ the volume of hardener. At high loadings ~5 wt % it was necessary to use an equal volume of solvent. In addition, it was necessary to cool the hardener/nanotube mix using an icewater bath to prevent the solvent from evaporating (mixture gets warm during the dispersion process). Dispersion time was typically 30 min. No significant improvement to the quality of dispersion was observed for longer mixing periods. Once the nanotubes were well dispersed the epoxy moiety was added and dispersion tool was used for about 1 min to ensure good mixing. For casting of monoliths the mixture was poured into suitable moulds made of silicone rubber coated with PTFE spray. Some shrinkage occurred where large volume of solvents had been employed. Insignificant shrinkage was observed in low loaded samples. Once cured the nanotube/epoxy composite could be machined to a required size (e.g. to fit a waveguide).

In the second, carbon nanotubes are dispersed in resin by first mixing the epoxy and hardener in a mortar. Then with the aid of a pestle, the nanotubes were admixed by vigorous hand stirring. This produced excellent dispersions of disentangled nanotubes, and worked well for both single and multiwall nanotubes.

The excellent exfoliation that was achieved can be seen in the transmission electron micrographs shown in FIG. 8(a) and, at higher magnification, in FIG. 8(b).

As the quality of the nanotube dispersion improves, the optical transmissivity of the nanotube/resin mixture decreases. Similarly, the infra-red transmissivity also decreases as the quality of the nanotube dispersion improves. Alignment of the nanotubes is formed when shear is applied to a nanotube/paraffin oil mix. It is anticipated that such alignment could be used, for example in a microwave polariser.

In order to achieve higher resolution patterning than possible using sprays and paints, nanotube meshes were generated by fabricating nanotube mats (referred to hereinafter as 'nanopaper') and then machining the appropriate pattern into the nanopaper.

The process described above for the dispersion of nanotubes in organic solvents was modified to allow the preparation of highly dispersed stable nanotube sols in large volumes. Excellent exfoliation of the carbon nanotubes is essential if high quality, flaw-free nanopaper of high electrical conductivity and of controllable dimensions is to be obtained.

EXAMPLE 4

The paper was made by dispersing the nanotubes in a suitable carrier fluid (1,2-dichlorobenzene has found to be good) by mechanical stirring and the application of ultrasound. The suspension was then filtered through a fine-bore Millipore filter [PVDF (Polyvinylidene fluoride) 90 mm diameter 0.65 micron pore size] and the nanotubes formed a pad. Careful drying furnished a dry paper. The method of drying was crucial to the manufacture of large continuous sheets. Once all of the liquid had been sucked through the filter, the vacuum (suction) was applied for a further 3 h. until the paper had dried. The exposed surface of the nanopaper was carefully placed onto one side of double-sided sticky tape (the other side of the tape still having its protective cover). With the nanopaper adhered to the double-sided sticky tape the Millipore membrane was removed. The protecting cover was removed from the other side of the sticky tape and the nanotube paper/sticky tape composite was placed on the frame ready for laser processing.

Using the above method according to an embodiment of the invention, it is possible to repeatedly prepare circular nanopaper of prescribed thickness. Excellent quality nanopaper can be fabricated in circular sheets as large as 90 mm diameter using this method.

Mechanical machining of the nanopaper is possible, but not preferred since good control over the positioning and dimensions of the holes is difficult and the resulting crude grids are prone to tearing if not handled very carefully. Laser drilling is a more satisfactory approach to the machining of the nanopaper. By adjustment of the optical set-up and the power level of the laser, together with careful positioning of the applied laser light, the porosity, and hence optical quality, of the nanogrids can be controlled. FIG. 9 demonstrates how the optical transparency of nanogrids can be adjusted for 80 micron thick nanopaper.

A modification of this method allows manufacture of nanogrid appliqués that can be transferred to both glass and zinc sulphide substrate to fabricate an electro-optic window. The window is made by attaching the nanogrid appliqué to the substrate. The laser hole-drilling technique is applied to a large area of nanopaper. Large area hole arrays are generated. The expansion to large area arrays requires a suitable optical arrangement and the appropriate power levels in order to produce the fine grids required for the window. Free-standing nanogrids can be prepared with excellent optical quality, but are too delicate for convenient handling and are easily damaged. Impregnation of the nanopaper with epoxy resin improves the robustness of the nanogrid.

An alternative to the above method is to use a double sided adhesive film that fulfils the requirements of adhering strongly to the nanopaper, adhering strongly to glass, and being amenable to laser drilling (many candidate films are unsuitable because the laser is unable to penetrate the adhesive layer). A suitable adhesive film double-sided adhesive sheet available from Hobby Craft Limited, Notley Road, Braintree, Essex, UK, although there are many other sources.

Large area nanopaper was pressed onto one side of the chosen adhesive film. The composite was then mounted on a frame that exposed the area to be laser drilled (FIG. 11).

An excimer laser (308 nm) having a max/min peak power of 0.5 J/pulse was used, although for the present purposes a lower power was used in order to 'nibble' the carbon away. A rectangular beam was used of dimensions 23 mm by 8 mm and the beam passed through a micro lens array to give a rectangular footprint of laser spots.

Using the micro lens array an array of laser light spots was projected onto the sample at the focal length of the lens array. Typically, a 5 by 2 array was projected with a pitch length of 2.5 mm. The paper was illuminated with pulsed laser light at 100 Hz for 0.5 s (i.e. 50 shots per hole) in order to remove the carbon at the points of illumination. A process of step and repeat was used to increase the number of holes per unit area. In this process the footprint is shifted (say in y direction) a distance such that a second array of holes can be drilled between the first set. The step and repeat process is undertaken until the required number of holes is achieved in the y direction. The footprint can then be stepped in the x direction and the process repeated. In this way (rather like rastering) a perforated paper is generated having the required density of holes at a prescribed pitch.

For the paper shown in FIG. 11, the average hole size is about 235 μm and average line width (of remaining nanopaper) was about 85 μm. In a variation of this method the paper may be impregnated with epoxy, cyanoacrylate resins in order to stiffen it before laser drilling.

FIG. 12 shows schematically the lay-up of an electro-optic window 1200 in accordance with an embodiment of the invention. A nanogrid appliqué 1202, made as described above, is applied to a circular borosilicate glass disc 1204, 75 mm diameter, 7 mm thick. The edges of the slightly oversize nanotube appliqué 1202 are folded over the circumferential edge of the disc 1204 and the nanotube window is mounted in a metal housing 1206. The window is glued into place using an electrically conductive siloxane 1208 to ensure electrical continuity between window and housing. Nanogrid appliqué 1202 provides enhanced microwave shielding to window 1200.

An alternative to laser drilling is to imprint a nanogrid directly onto a substrate. A metal mesh, of a similar porosity to that currently used as the reflective element in infra-red windows, pressed into the top surface of a zinc sulphide window with nanopaper between the ZnS substrate and the metal mesh. After applying pressure to the sandwich and removing of the metal grid a faithful nanotube copy is printed onto the zinc sulphide (FIG. 10). The nanotube copy thus provides the resultant window with enhanced microwave shielding.

The windows made using nanopaper can be combined with a transparent paint. Such a paint could be applied either before or after the nanopaper has been deposited and shaped on the window. Alternatively the nanopaper could be soaked in the paint prior to being attached to the window.

The invention claimed is:

1. An electro-optic window comprising a material substantially transparent to at least one selected from the group consisting of infra-red and visible radiation, the material being treated to have reduced RF transmission characteristics by the provision of carbon nanotubes provided as a layer on at least one surface of the window, wherein the at least one layer of carbon nanotubes has a mat structure and includes an array of holes.

2. An electro-optic window according to claim 1, wherein said holes are formed by laser drilling.

3. An electro-optic window according to claim 1, wherein said carbon nanotubes are incorporated into a film applied to a surface of said material transparent to infra-red and/or visible radiation, said film comprising a polymer material incorporating said carbon nanotubes.

4. An electro-optic window according to claim 1, wherein said carbon nanotubes are incorporated into the material transparent to infra-red and/or visible radiation during formation of the window.

5. An electro-optic window according to claim 1, wherein said material transparent to infra-red and/or visible radiation comprises a crystalline material.

6. An electro-optic window according to claim 1, wherein said material substantially transparent to radiation comprises a glass material.

7. An electro-optic window according to claim 1, wherein the material is substantially transparent to infra-red radiation and the array of holes are configured to increase the infrared (IR) transmission characteristics of the window.

8. An electro-optic window according to claim 1, wherein the carbon nanotubes are multi-wall carbon nanotubes.

9. A method of making an electro-optic window which comprises providing a distribution of carbon nanotubes on at least one surface thereof by providing a mat made of carbon nanotubes, and bonding the mat to the surface of the window, wherein the mat is provided with an array of holes to increase the IR transmission characteristics of the window.

10. A method according to claim 9, wherein said holes are formed by laser drilling.

11. A method according to claim 9, which comprises dispersing said nanotubes in a resin or polymer and thereafter applying said polymer to the surface of a window material.

12. A method according to claim 9, which comprises depositing nanotubes onto an electro-optic window by chemical vapour deposition.

13. A method according to claim 9, wherein the carbon nanotubes are multi-wall carbon nanotubes.

14. A method according to claim 9, wherein said distribution is provided by applying a dryable or curable liquid carrier containing a dispersion of carbon nanotubes.

15. A method according to claim 14, wherein said liquid carrier is applied by spraying, optionally through a mask.

16. A method according to claim 14, wherein said liquid carrier is applied to said window using a spin-on process.

17. A method according to claim 9, which comprises providing a window precursor material in particulate form and dispersing carbon nanotubes within said window precursor material to form a composite material.

18. A method according to claim 17, wherein said carbon nanotubes are initially coated with said window material.

19. A method according to claim 17, wherein said window precursor material particles are substantially mono-disperse.

20. A method according to claim 19, which comprises providing said particulate window material in colloidal form and dispersing carbon nanotubes in said colloid, and thereafter drying said colloid.

21. A method according to claim 20, which comprises applying elevated pressure and temperature to said dried colloid to form said window.

* * * * *